(12) United States Patent
Wang

(10) Patent No.: US 10,418,570 B2
(45) Date of Patent: Sep. 17, 2019

(54) CURVED SCREEN ATTACHING DEVICE AND ATTACHING METHOD USING THE SAME

(71) Applicant: WUHAN CHINA STAR OPTOELECTRONICS TECHNOLOGY CO., LTD., Wuhan, Hubei (CN)

(72) Inventor: Jianbo Wang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 178 days.

(21) Appl. No.: 15/566,744

(22) PCT Filed: May 3, 2017

(86) PCT No.: PCT/CN2017/082811
§ 371 (c)(1),
(2) Date: Oct. 16, 2017

(87) PCT Pub. No.: WO2018/176564
PCT Pub. Date: Oct. 4, 2018

(65) Prior Publication Data
US 2019/0051847 A1 Feb. 14, 2019

(30) Foreign Application Priority Data
Mar. 30, 2017 (CN) .......................... 2017 1 0203336

(51) Int. Cl.
| | | |
|---|---|---|
| H05K 1/00 | (2006.01) | |
| H01L 51/00 | (2006.01) | |
| H01F 1/117 | (2006.01) | |
| G06F 1/16 | (2006.01) | |
| H05K 7/00 | (2006.01) | |
| H05K 1/18 | (2006.01) | |

(Continued)

(52) U.S. Cl.
CPC ........ *H01L 51/0097* (2013.01); *G06F 1/1652* (2013.01); *H01F 1/117* (2013.01); *G03B 21/58* (2013.01); *G06F 1/1601* (2013.01); *G06F 1/1616* (2013.01); *H01L 51/5237* (2013.01); *H01L 2251/5338* (2013.01)

(58) Field of Classification Search
CPC ..... G06F 1/1601; G06F 1/1616; G03B 21/58; H01L 51/0097; H01L 2251/5338
USPC ...... 361/679.21, 679.27, 749; 359/461, 538; 313/511; 257/89; 362/600
See application file for complete search history.

(56) References Cited

U.S. PATENT DOCUMENTS

2017/0300084 A1* 10/2017 Morrison .............. G06F 1/1616

* cited by examiner

*Primary Examiner* — Binh B Tran
(74) *Attorney, Agent, or Firm* — Mark M. Friedman

(57) ABSTRACT

A curved screen attaching device is provided for achieving an attachment between a flexible display layer and a curved cover, and includes: a base platform formed with a curved surface on an upper surface thereof; a magnet layer provided on a bottom of the curved surface and having a plurality of strip-type magnetic field generators disposed independent of each other; an attaching roller magnetically attracted to and moved on the curved surface to process a roll forming on the flexible display layer; and a controller configured to control the strip-type magnetic field generators to be switched on or off to form a moving magnetic field to guide and move the attaching roller.

16 Claims, 2 Drawing Sheets

(51) Int. Cl.
*G03B 21/58* (2014.01)
*H01L 51/52* (2006.01)

CURVED SCREEN ATTACHING DEVICE AND ATTACHING METHOD USING THE SAME

FIELD OF THE INVENTION

The present disclosure relates to a display screen attaching device, and more particularly to a curved screen attaching device and an attaching method using the same.

BACKGROUND OF THE INVENTION

The liquid crystal display (LCD) field is now in a mature stage, wherein a flexible organic light-emitting diode (OLED) display will be a new growing point in the future of the display field. A flexible feature of the flexible OLED is continuously being developed and used. For example, the flexible OLED can be attached to a curved glass cover to achieve a front display and an edge display of a product.

Refer now to FIG. 1, which is a conventional method to achieve a 3D attachment of a flexible OLED, and the method includes steps of: (1) providing a lower fixing module 101, wherein an arc-shaped projection surface is formed on an upper portion of the lower fixing module 101; and providing a upper fixing module 102, wherein an arc-shaped recessed surface is formed on an lower portion of the upper fixing module 102, wherein the upper fixing module 102 is located right above the lower fixing module 101, and the arc-shaped projection surface and the arc-shaped recessed surface can match with each other; (2) attaching a flexible OLED panel 103 on the arc-shaped projection surface of the lower fixing module 101, and attracting a curved glass cover 104 on the arc-shaped recessed surface of the upper fixing module 102; and (3) matching the upper fixing module 102 with the lower fixing module 101, thereby the flexible OLED panel 103 and the curved glass cover 104 can attach to each other.

However, a conventional attaching device can only achieve an attachment of an OLED panel with a smaller curvature, but when the curved surface design of the two ends of the OLED panel is bent more toward the inside of the panel, the conventional attaching device cannot be used to achieve the attachment.

SUMMARY OF THE INVENTION

The present disclosure provides a curved screen attaching device and an attaching method using the same, which can achieve an attachment of a curved screen with a greater curvature, so as to solve the problem: in a conventional attaching device, only an attachment of an OLED panel with a smaller curvature can be achieved, but when the curved surface design of the two ends of the OLED panel is bent more toward the inside of the panel, the conventional attaching device cannot be used to achieve the attachment.

To solve the above-mentioned problems, the present disclosure provides technical solutions as follows:

The present disclosure provides a curved screen attaching device configured to achieve an attachment between a flexible display layer and a curved cover, which comprises: a base platform formed with a curved surface on an upper surface thereof, wherein a curvature of the curved surface is matched with that of the curved cover, so as to fit the curved cover; a magnet layer attached on all regions of a bottom of the curved surface, and configured to cause the curved surface to produce a magnetic field attraction, wherein the magnet layer includes a plurality of strip-type magnetic field generators which are disposed independent of each other; each of the strip-type magnetic field generators is parallel to each other; and the strip-type magnetic field generators are closely arranged along a bending direction of the curved surface;

an attaching roller magnetically attracted to and moved on the curved surface, and configured to process a roll forming on the flexible display layer; and a controller configured to control each of the strip-type magnetic field generators to be switched on or off in order along the bending direction of the curved surface, wherein when a next strip-type magnetic field generator of the strip-type magnetic field generators is switched on, a previous strip-type magnetic field generator thereof is switched off, so as to form a moving magnetic field to guide and move the attaching roller;

wherein an input electric current of one of the strip-type magnetic field generators located at a greater curvature portion of the curved surface is set greater than that of one of the strip-type magnetic field generators located at a smaller curvature portion of the curved surface.

According to a preferable embodiment of the present disclosure, a length of the attaching roller is greater than or equal to a minimum width of the base platform.

According to a preferable embodiment of the present disclosure, limiting stoppers are disposed at two ends of the attaching roller, and an edge of the limiting stopper are extended out of the attaching roller.

According to a preferable embodiment of the present disclosure, the limiting stopper is a circular sheet; the circle center of the limiting stopper matches with that of an end surface of the attaching roller; and a diameter of the limiting stopper is greater than that of the end surface of the attaching roller.

According to a preferable embodiment of the present disclosure, a width of the strip-type magnetic field generator located at the greater curvature portion of the curved surface is set smaller than that of the strip-type magnetic field generator located at the smaller curvature portion of the curved surface.

According to a preferable embodiment of the present disclosure, the attaching roller is a metal roller, and a surface of the attaching roller is adhered with a silica gel layer.

According to a preferable embodiment of the present disclosure, an end surface of the attaching roller is polygonal.

According to a preferable embodiment of the present disclosure, two adjacent edges of the polygon are connected by a curved line.

The present disclosure further provides a curved screen attaching device configured to achieve an attachment between a flexible display layer and a curved cover, which comprises:

a base platform formed with a curved surface on an upper surface thereof, wherein a curvature of the curved surface is matched with that of the curved cover, so as to fit the curved cover;

a magnet layer attaching on all regions of a bottom of the curved surface, and configured to cause the curved surface to produce a magnetic field attraction, wherein the magnet layer includes a plurality of strip-type magnetic field generators, which are disposed independent of each other; each of the strip-type magnetic field generators is parallel to each other; and the strip-type magnetic field generators are closely arranged along a bending direction of the curved surface;

an attaching roller magnetically attracted to and moved on the curved surface, and configured to process a roll forming on the flexible display layer; and a controller configured to control each of the strip-type magnetic field generators to be switched on or off in order along the bending direction of the curved surface, wherein when a next strip-type magnetic field generator of the strip-type magnetic field generators is switched on, a previous strip-type magnetic field generator thereof is switched off, so as to form a moving magnetic field to guide and move the attaching roller.

According to a preferable embodiment of the present disclosure, a length of the attaching roller is greater than or equal to a minimum width of the base platform.

According to a preferable embodiment of the present disclosure, limiting stoppers are disposed at two ends of the attaching roller, and an edge of the limiting stopper are extended out of the attaching roller.

According to a preferable embodiment of the present disclosure, the limiting stopper is a circular sheet; the circle center of the limiting stopper matches with that of an end surface of the attaching roller; and a diameter of the limiting stopper is greater than that of the end surface of the attaching roller.

According to a preferable embodiment of the present disclosure, a width of one of the strip-type magnetic field generators located at a greater curvature portion of the curved surface is set smaller than that of one of the strip-type magnetic field generators located at a smaller curvature portion of the curved surface.

According to a preferable embodiment of the present disclosure, the attaching roller is a metal roller, and a surface of the attaching roller is adhered with a silica gel layer.

According to a preferable embodiment of the present disclosure, an end surface of the attaching roller is polygonal.

According to a preferable embodiment of the present disclosure, two adjacent edges of the polygon are connected by a curved line.

According to the above-mentioned curved screen attaching device, an attaching method of a curved screen is provided, and the method comprises steps of:

putting the curved cover on the curved surface of the base platform, wherein the curved cover is attached to the curved surface;

putting the flexible display layer on a surface of the curved cover;

putting the attaching roller on the surface of the flexible display layer close to a middle position of the flexible display layer;

using the controller to switch on a first one of the strip-type magnetic field generators under the attaching roller, and then switching on a second one of the strip-type magnetic field generators adjacent to the first one while switching the previous first one strip-type magnetic field generator off; and moving the attaching roller through all regions of the flexible display layer to finish the attachment.

According to a preferable embodiment of the present disclosure, the step of "moving the attaching roller through all regions of the flexible display layer" includes steps of: using the controller to control and roll the attaching roller firstly from the middle position to one end of the flexible display layer, and then rolling the attaching roller from the one end of the flexible display layer to the opposite end of the flexible display layer.

The advantageous effects of the present disclosure are: compared with a conventional curved screen attaching device, the curved screen attaching device of the present disclosure can achieve an attachment between an OLED panel with a greater curvature and a curved glass cover, so as to solve the problem: in a conventional attaching device, only an attachment of an OLED panel with a smaller curvature can be achieved, but when the curved surface design of the two ends of the OLED panel is bent more toward the inside of the panel, the conventional attaching device cannot be used to achieve the attachment.

DESCRIPTION OF THE DRAWINGS

In order to more clearly illustrate technical solutions of embodiments or in the prior art, accompany drawings which need to be used in the description of the embodiments or the prior art will be simply introduced. Obviously, the accompany drawings in the following description are merely some embodiments, and for those of ordinary skill in the art, other embodiments can further be obtained according to these accompany drawings without contributing any creative work.

DETAILED DESCRIPTION OF THE PREFERRED EMBODIMENTS

Figure 1:
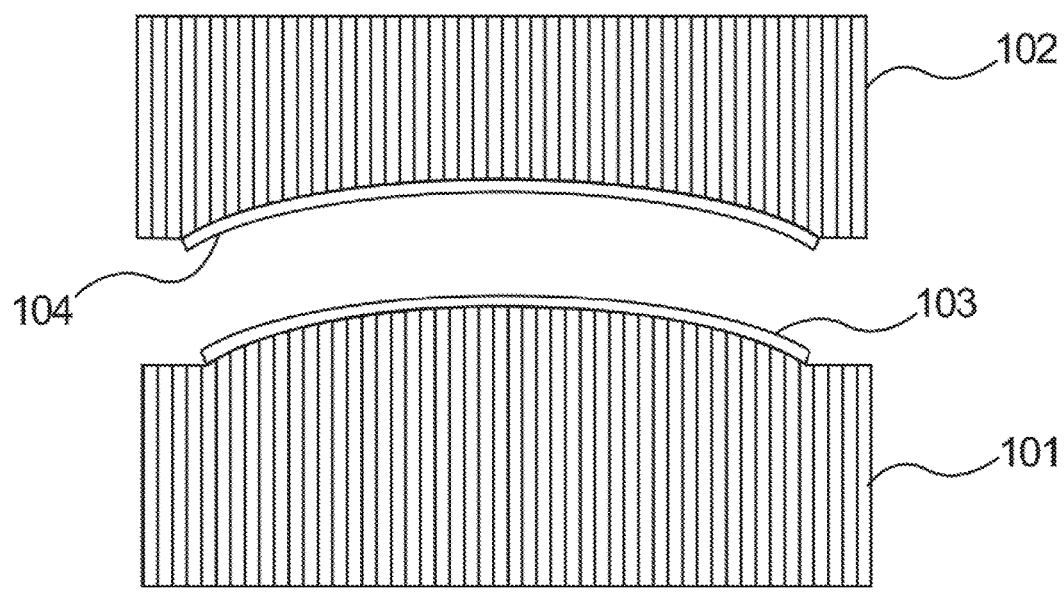
FIG. 1 is a schematic structural view of a curved screen attaching device of a prior art.

The foregoing objects, features, and advantages adopted by the present disclosure can be best understood by referring to the following detailed description of the preferred embodiments and the accompanying drawings. Furthermore, the directional terms described in the present disclosure, such as upper, lower, front, rear, left, right, inside, outer, side, etc., are only directions with reference to the accompanying drawings, so that the used directional terms are used to describe and understand the present disclosure, but the present disclosure is not limited thereto. In the drawings, units with similar structures use the same numerals.

The present disclosure can solve the technical problems of the prior art: a conventional curved screen attaching device can only achieve an attachment of an OLED panel with a smaller curvature, but when the curved surface design of the two ends of the OLED panel is bent more toward the inside of the panel, the conventional attaching device cannot be used to achieve the attachment. The embodiment can solve the defect.

The present disclosure provides a curved screen attaching device configured to achieve an attachment between a flexible display layer and a curved cover, and the curved screen attaching device includes:

a base platform, wherein a curved surface is formed on an upper surface of the base platform, and the curved surface is a recessed surface, and a curvature of the curved surface is matched with the curved cover, so as to fit and fix the curved cover;

a magnet layer attaching on all regions of a bottom of the curved surface, and configured to cause the curved surface to produce a magnetic field attraction, wherein the magnet layer includes a certain number of strip-type magnetic field generators, which are independent of each other; each of the strip-type magnetic field generators is parallel to each other;

and the strip-type magnetic field generators are closely arranged along a bending direction of the curved surface; an attaching roller magnetically attracted to and moved on the curved surface, and configured to process a roll forming on the flexible display layer; and a controller configured to control each of the strip-type magnetic field generators to be switched on/off in order along the bending direction of the curved surface, wherein when any one of the strip-type magnetic field generators is switched on, the previous strip-type magnetic field generator is switched off, so as to form a moving magnetic field to guide and move the attaching roller.

As the strip-type magnetic field generator is switched on, the strip-type magnetic field generator generates a magnetic force therewith, and has a magnetic attaching function to the attaching roller disposed thereon. The attaching roller presses on an upper surface of the flexible display layer, and by the weight itself and the magnetic attaching function of the strip-type magnetic field generator, the attaching roller rolls and presses the flexible display layer, so as to attach the flexible display layer onto a surface of the curved glass cover, wherein as the attaching roller passes, the attachment is finished. Because all regions of the bottom of the curved surface are provided with the strip-type magnetic field generator, the attaching roller can be moved to all of the regions of the curved surface, and it will not be influenced by a curvature design of the curved screen.

Figure 2:
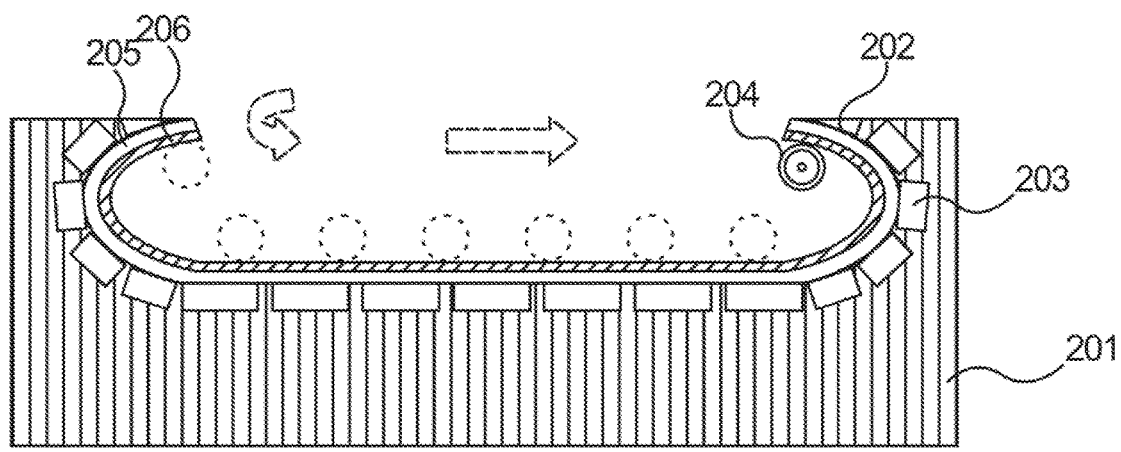
FIG. 2 is a schematic structural view of a curved screen attaching device according to the present disclosure.
Figure 3:
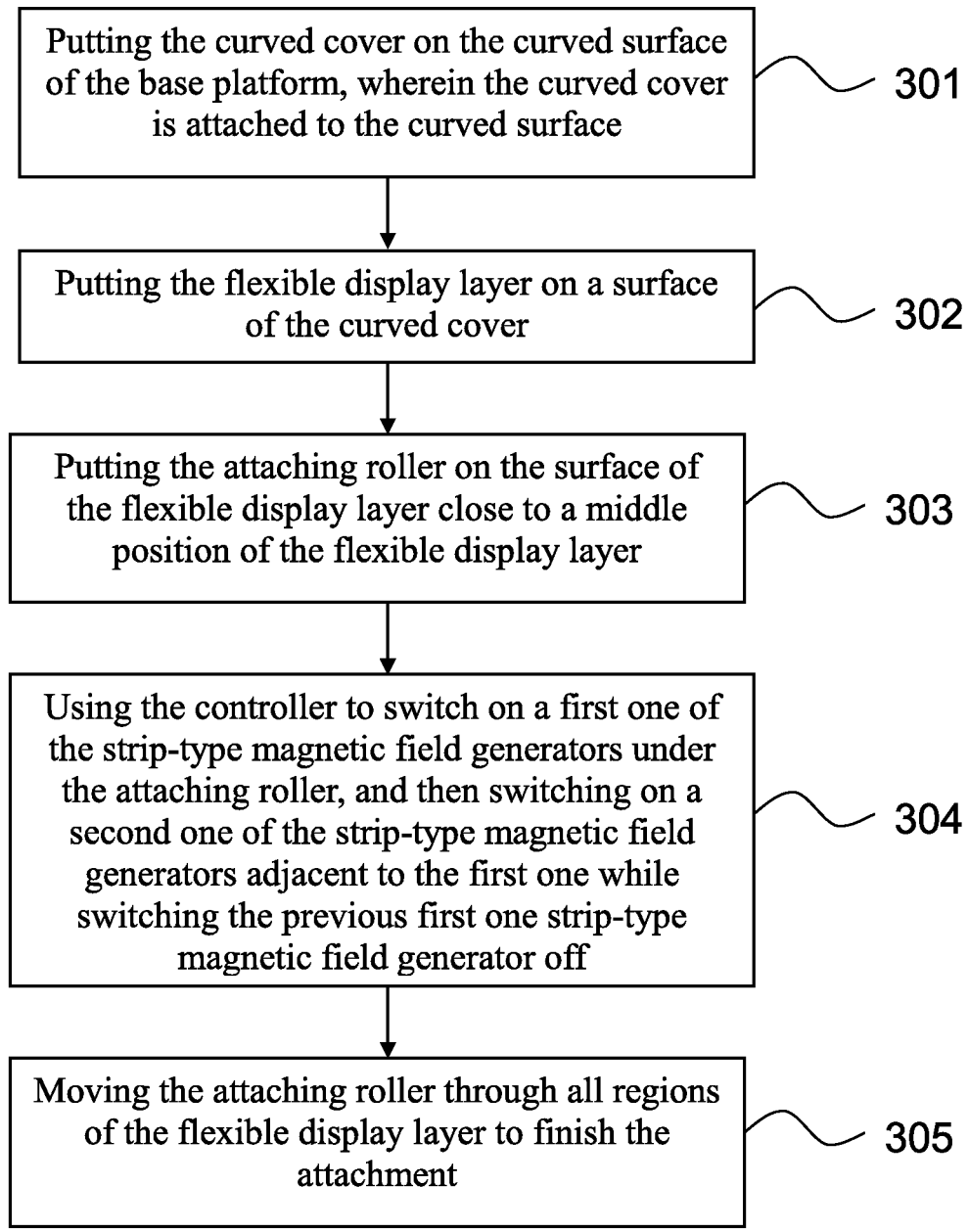
FIG. 3 is a flow chart of an attaching method of the curved screen attaching device according to the present disclosure.

Refer now to FIG. 2, which is a curved screen attaching device according to the present disclosure, which includes a base platform 201, wherein a recessed curved surface 202 is formed on an upper surface of the base platform 201; a bottom of the curved surface 202 is closely arranged with a certain number of strip-type magnetic field generators 203; the strip-type magnetic field generators 203 are arranged parallel to each other, and are arranged along a bending direction of the curved surface 202, so as to form a moving track for a attaching roller 204; and a curved glass cover 205 is matched and fixed on the curved surface, and a flexible display layer 206 is put on the curved glass cover 205.

Generally, in a panel with a greater curvature, the greatest curvature portion is at two ends of the panel, and at a middle portion of the panel is a flatter portion. When the attaching roller 204 is moved from a flat portion to a greater curvature region, namely during a climb stage, by an influence of the weight of the attaching roller 204 and the smooth surface of the panel, the climb action is strenuous. By changing the structure of the strip-type magnetic field generators, the defect can be solved.

For example, a width of one of the strip-type magnetic field generators 203 located at a greater curvature portion of the curved surface 202 is set smaller than that of one of the strip-type magnetic field generators 203 located at a smaller curvature portion of the curved surface 202. That is, by decreasing the width of the strip-type magnetic field generators 203, a density of the strip-type magnetic field generators 203 at the greater curvature portion of the curved surface 202 is increased, so that for the attaching roller 204, in the same stroke distance, an arranging density of magnetic field at the greater curvature portion of the curved surface 202 is greater than that at the smaller curvature portion of the curved surface 202. Therefore, when switching the adjacent strip-type magnetic field generators 203, the attracting force for the attaching roller 204 being reduced can be avoided.

For another example, an input electric current of one of the strip-type magnetic field generators 203 located at a greater curvature portion of the curved surface 202 is set greater than that of one of the strip-type magnetic field generators 203 located at a smaller curvature portion of the curved surface. That is, by inputting a greater electric current to the strip-type magnetic field generators 203 at the greater curvature portion, the magnetic attaching function force for the attaching roller 204 is increased, so that the climbing ability of the attaching roller 204 is increased.

By changing the structure of the attaching roller 204, the above-mentioned defect can also be solved. For example, the attaching roller 204 is selected as a prism, namely the shape of the end surface of the attaching roller 204 is polygonal, so that the surfaces of the attaching roller 204 contacting with the flexible display layer 206 is formed by connecting a plurality of planes. Compared with a cylinder attaching roller 204, the distance between each region of one of the planes and one of the strip-type magnetic field generators 203 are the same. But, in each region of the curved surface 202, distances between each one of the strip-type magnetic field generators 203 are increased progressively from a middle region to two side regions. In relative terms, the prism attaching roller 204 can get more attracting force in the same location, and a better attracting ability, so that the climbing ability of the attaching roller 204 in the greater curvature region is increased.

Preferably, in the prism attaching roller 204, a connecting portion between the two planes adjacent to each other is connected by a curve. In other words, in the polygon of the end surface of the attaching roller 204, two adjacent edges are connected by a curved line. Therefore, the attracting ability of the attaching roller 204 is increased, and at the same time, the roll action of the attaching roller 204 is more convenient, so as to increase the attaching effect.

During a movement process of the attaching roller 204, there may be a slant situation. If the attaching roller 204 has a slight slant and keeps moving, it will cause the slant angle to be enlarged, so that the attaching roller 204 cannot reach the end of the curved surface, and at the same time, the moving track for the attaching roller 204 cannot cover all of the flexible display layer 206, so that the quality of the attachment of the flexible display layer 206 will be influenced. By changing the structure of the attaching roller 204, the defect can be solved.

For example, the length of the attaching roller 204 is greater than or equal to a minimum width of the base platform 201, so that the slight slant during the movement process of the attaching roller 204 will not influence the quality of the attachment.

For another example, limiting stoppers are disposed at two ends of the attaching roller 204, wherein an edge of the limiting stopper are extended out of the attaching roller 204, for example the limiting stopper is a circular sheet, wherein the circle center of the limiting stopper matches with that of the end surface of the attaching roller 204, and the diameter of the limiting stopper is greater than that of the end surface of the attaching roller 204. Furthermore, the number of the limiting stoppers is a plurality, and the limiting stoppers are disposed spaced at intervals outside of the end portions of the attaching roller 204.

During a movement process of the attaching roller 204, the limiting stopper can limit the attaching roller 204 on the base platform 201, so that it can only be moved toward the bending direction of the curved surface, so that the limiting stoppers and the strip-type magnetic field generators 203 can be kept in a parallel situation, so as to keep the attaching roller 204 from a magnetic field deviation.

The attaching roller 204 is a metal roller, and the surface of the attaching roller 204 is adhered with a silica gel layer, which can help to increase the friction between the attaching roller 204 and the contacting surface thereof, so as to have a preferable climbing ability.

According to the above-mentioned curved screen attaching device, an attaching method of a curved screen is provided, and the method includes the following steps of:

S301: putting the curved cover on the curved surface of the base platform, wherein the curved cover is attached to the curved surface.

S302: putting the flexible display layer on a surface of the curved cover.

S303: putting the attaching roller on the surface of the flexible display layer close to a middle position of the flexible display layer.

S304: using the controller to switch on a first one of the strip-type magnetic field generators under the attaching roller, and then switching on a second one of the strip-type magnetic field generators adjacent to the first one while switching the previous first one strip-type magnetic field generator off.

S305: moving the attaching roller through all regions of the flexible display layer to finish the attachment.

Preferably, the step of "moving the attaching roller through all regions of the flexible display layer" includes steps of: using the controller to control and roll the attaching roller firstly from the middle position to one end of the flexible display layer, and then rolling the attaching roller from the one end of the flexible display layer to the opposite end of the flexible display layer.

The advantageous effects of the present disclosure are: compared with a conventional curved screen attaching device, the curved screen attaching device of the present disclosure can achieve an attachment between an OLED panel with a greater curvature and a curved glass cover, so as to solve the problem: in a conventional attaching device, only an attachment of an OLED panel with a smaller curvature can be achieved, but when the curved surface design of the two ends of the OLED panel is bent more toward the inside of the panel, the conventional attaching device cannot be used to achieve the attachment.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A curved screen attaching device configured to achieve an attachment between a flexible display layer and a curved cover, comprising:
   a base platform formed with a curved surface on an upper surface thereof, wherein a curvature of the curved surface is matched with that of the curved cover, so as to fit the curved cover;
   a magnet layer attached on all regions of a bottom of the curved surface, and configured to cause the curved surface to produce a magnetic field attraction, wherein the magnet layer includes a plurality of strip-type magnetic field generators which are disposed independent of each other;
   each of the strip-type magnetic field generators is parallel to each other;
   and the strip-type magnetic field generators are closely arranged along a bending direction of the curved surface;
   an attaching roller magnetically attracted to and moved on the curved surface, and configured to process a roll forming on the flexible display layer; and
   a controller configured to control each of the strip-type magnetic field generators to be switched on or off in order along the bending direction of the curved surface, wherein when a next strip-type magnetic field generator of the strip-type magnetic field generators is switched on, a previous strip-type magnetic field generator thereof is switched off, so as to form a moving magnetic field to guide and move the attaching roller;
   wherein an input electric current of one of the strip-type magnetic field generators located at a greater curvature portion of the curved surface is set greater than that of one of the strip-type magnetic field generators located at a smaller curvature portion of the curved surface.

2. The curved screen attaching device according to claim 1, wherein a length of the attaching roller is greater than or equal to a minimum width of the base platform.

3. The curved screen attaching device according to claim 2, wherein limiting stoppers are disposed at two ends of the attaching roller, and an edge of the limiting stopper are extended out of the attaching roller.

4. The curved screen attaching device according to claim 3, wherein the limiting stopper is a circular sheet; the circle center of the limiting stopper matches with that of an end surface of the attaching roller; and a diameter of the limiting stopper is greater than that of the end surface of the attaching roller.

5. The curved screen attaching device according to claim 1, wherein a width of the strip-type magnetic field generator located at the greater curvature portion of the curved surface is set smaller than that of the strip-type magnetic field generator located at the smaller curvature portion of the curved surface.

6. The curved screen attaching device according to claim 1, wherein the attaching roller is a metal roller, and a surface of the attaching roller is adhered with a silica gel layer.

7. The curved screen attaching device according to claim 1, wherein an end surface of the attaching roller is polygonal.

8. A curved screen attaching device configured to achieve an attachment between a flexible display layer and a curved cover, comprising:
   a base platform formed with a curved surface on an upper surface thereof, wherein a curvature of the curved surface is matched with that of the curved cover, so as to fit the curved cover;
   a magnet layer attaching on all regions of a bottom of the curved surface, and configured to cause the curved surface to produce a magnetic field attraction, wherein the magnet layer includes a plurality of strip-type magnetic field generators, which are disposed independent of each other;
   each of the strip-type magnetic field generators is parallel to each other;
   and the strip-type magnetic field generators are closely arranged along a bending direction of the curved surface;
   an attaching roller magnetically attracted to and moved on the curved surface, and configured to process a roll forming on the flexible display layer; and
   a controller configured to control each of the strip-type magnetic field generators to be switched on or off in order along the bending direction of the curved surface, wherein when a next strip-type magnetic field generator of the strip-type magnetic field generators is switched on, a previous strip-type magnetic field generator thereof is switched off, so as to form a moving magnetic field to guide and move the attaching roller.

9. The curved screen attaching device according to claim 8, wherein a length of the attaching roller is greater than or equal to a minimum width of the base platform.

10. The curved screen attaching device according to claim 9, wherein limiting stoppers are disposed at two ends of the attaching roller, and an edge of the limiting stopper are extended out of the attaching roller.

11. The curved screen attaching device according to claim 10, wherein the limiting stopper is a circular sheet; the circle center of the limiting stopper matches with that of an end surface of the attaching roller; and a diameter of the limiting stopper is greater than that of the end surface of the attaching roller.

12. The curved screen attaching device according to claim 8, wherein a width of one of the strip-type magnetic field generators located at a greater curvature portion of the curved surface is set smaller than that of one of the strip-type magnetic field generators located at a smaller curvature portion of the curved surface.

13. The curved screen attaching device according to claim 8, wherein the attaching roller is a metal roller, and a surface of the attaching roller is adhered with a silica gel layer.

14. The curved screen attaching device according to claim 8, wherein an end surface of the attaching roller is polygonal.

15. An attaching method of a curved screen, using the curved screen attaching device according to claim 9, and comprising steps of:
putting the curved cover on the curved surface of the base platform, wherein the curved cover is attached to the curved surface;
putting the flexible display layer on a surface of the curved cover;
putting the attaching roller on the surface of the flexible display layer close to a middle position of the flexible display layer;
using the controller to switch on a first one of the strip-type magnetic field generators under the attaching roller, and then switching on a second one of the strip-type magnetic field generators adjacent to the first one while switching the previous first one strip-type magnetic field generator off; and
moving the attaching roller through all regions of the flexible display layer to finish the attachment.

16. The attaching method according to claim 15, wherein the step of moving the attaching roller through all regions of the flexible display layer includes steps of: using the controller to control and roll the attaching roller firstly from the middle position to one end of the flexible display layer, and then rolling the attaching roller from the one end of the flexible display layer to an opposite end of the flexible display layer.

* * * * *